340-566
10/26/82 XR 4,356,423 SR

United States Patent [19] [11] 4,356,423
Gudzin [45] Oct. 26, 1982

[54] PRESSURE SENSITIVE INTRUSION SENSING LINE

[75] Inventor: Martin G. Gudzin, Dallas, Tex.

[73] Assignee: Teledyne Industries, Inc., Geotech Division, Dallas, Tex.

[21] Appl. No.: 211,003

[22] Filed: Nov. 28, 1980

[51] Int. Cl.³ .............................................. H01L 41/04
[52] U.S. Cl. ................................... 310/338; 310/344; 310/348; 340/566; 340/665
[58] Field of Search ............... 310/338, 340, 342, 344, 310/348; 340/565-567, 665-666

[56] References Cited

U.S. PATENT DOCUMENTS

| | | | |
|---|---|---|---|
| 2,592,703 | 4/1952 | Jaffe | 310/328 |
| 3,868,954 | 3/1975 | Ueda | 310/330 X |
| 3,970,878 | 7/1976 | Berglund | 310/333 |
| 4,012,649 | 3/1977 | Cook | 310/338 |
| 4,097,025 | 6/1978 | Dettmann | 340/566 X |
| 4,186,325 | 1/1980 | Gudzin | 310/338 X |
| 4,194,194 | 3/1980 | Redfern | 310/338 X |

*Primary Examiner*—William M. Shoop
*Assistant Examiner*—Peter S. Wong
*Attorney, Agent, or Firm*—Dowell & Dowell

[57] ABSTRACT

An intrusion sensing line to be buried or emersed in a medium and operative to deliver electrical signals in response to pressure changes as the medium is stressed, the line including multiple metal shells each having a transducer bonded to a flexible diaphragm surface inside the shell, and the shells being spaced apart and joined by soft metal tubing, the tubing and shells being metal-to-metal bonded at all joints and sealed to retain a dry inert gas, and the transducers being insulated from the shells to which they are bonded and wired together, preferably with alternating polarities, by insulated wiring extending through the tubing and the shells.

8 Claims, 4 Drawing Figures

PRESSURE SENSITIVE INTRUSION SENSING LINE

BACKGROUND AND PRIOR ART

The protection of large areas or lengthy perimeters against intrusion presents considerable difficulty, although there have been many systems previously developed to accomplish this purpose. Particularly in the case of international borders, the expense of installing an effective sensing system is very large because of the length of the border, and because adequate protection requires the burial of a sensing line having a large number of sensors closely spaced along it. Not only is there a large number of sensors involved, but the protection of these sensors from damage by moisture and by the gnawing of burrowing animals is a serious problem. Moreover, minimizing the line's response to spurious stimulations induced for example by storms and power lines, and by natural seismic events, is quite difficult. In addition, there are problems of aging and drifting of electrical components which must be taken in to consideration. The present invention seeks to provide an intrusion detector line which protects itself from the above problems, while at the same time providing a large number of closely spaced pressure sensitive transducers which will deliver an adequate signal in response to the occurrence of an intrusion in a particular area. It is also necessary that the transducer line be sufficiently flexible to follow the contour of a trench when buried, or the bottom of a waterway when immersed, and to be capable of being rolled up for transportation.

U.S. Pat. Nos. 3,970,878 to Berglund and 4,012,649 to Cook et al show piezoceramic units sealed inside of metal cans, and using one surface of the can as a transducer diaphragm which also supports the piezoceramic disc so that the disc flexes with fluctuations in pressure applied to the metal container. However, in these patents the metal container itself is used as one of the electrodes which is electrically connected with a face of the piezoceramic disc.

U.S. Pat. Nos. 3,868,954 to Ueda and 2,592,703 to Jaffe both show ceramic transducer units comprising microphones in which the ceramic is supported on an insulator. However, it appears that in the Ueda patent one electrode is also coupled to the metal housing by a wire, and neither patent actually provides a strong fully enclosed metal container capable of being hermetically sealed.

U.S. Pat. No. 4,097,025 to Dettmann et al shows a line comprising a series of metal conduits 15 which are screwed into spaced metal service boxes 22, each of which has a surface supporting an insulating slab 32 to which is mounted a transducer assembly 31, the transducer being insulated from electrical contact with the service box 22 by the insulating disc 32. This structure appears to adequately protect the sensor elements from stray electrical fields, but it is a virtually rigid construction which would not be suitable for burial, and which is not capable of being rolled up, for instance in 100 meter lengths, for transportation to a perimeter site where it would be buried.

THE INVENTION

The present invention provides an improved structure for a pressure sensitive intrusion detecting line suitable for use as part of a buried array. Each detector comprises a small metal shell having two opposed similar cups which are soldered together at their flanges, and which shells each contain a piezoceramic disc operatively associated with one face of the shell which serves as a pressure-responsive diaphragm. The shells are spaced about a meter apart by lengths of small-diameter copper tubing, for instance, $\frac{1}{8}$ inch soft drawn tubing. The tubing enters one side of a shell and departs through the other side of the shell to the next shell. The tubing carries two insulated wires which are respectively connected to electrodes bonded on opposite faces of the piezoceramic transducers in the various shells, these transducers being all connected in parallel across the twin leads. Not only are the opposed cups soldered together around their peripheries, but the shells are also soldered to the ends of the lengths of copper tubing which enter and depart through snug fitting holes in the shell sides. Each piezoceramic transducer is mounted in operative relationship to the inner surface of a shell cup which surface forms a diaphragm. An insulating board is interposed between each piezoceramic transducer disc and the adjacent face of the shell diaphragm. The board is preferably metal clad on one side, and has its unclad surface epoxied to the diaphragm, the metal cladding on the board being then conductively bonded to the ceramic disc as one of its electrodes. When all of the metal-to-metal tubing and shell joints are soldered, the unit is effectively hermetically sealed by a connector attached to the wires at the first length of tubing where they enter the detection line, the last shell in the array having a length of copper tubing pinched and sealed so that it terminates the line. When the line is buried in a trench in the ground, typically about one foot under the surface, the trench is partly lined with sand in the vicinity of the transducer line so as to avoid contacting the shells with larger pebbles or stones, whereby the shells are buried in a much more homogeneous medium, the particles of which are very small as compared with the area of the diaphragm portion of each shell. No electrical connection is made between the wiring or the electrodes of the piezoceramic discs on the one hand, and the shell and copper tubing on the other hand, whereby the wiring and transducer discs are completely isolated from and electrically shielded by the protective shells and tubing. A typical transducer line comprises 100 or so transducer shells spaced about a meter apart on small diameter copper tubing. Tests have shown that the surface area to which each transducer shell is sensitive increases with the depth to which it is buried, but the absolute sensitivity to surface events, such as a man or vehicle approaching or crossing the line, decreases as depth of burial is increased. Since the decrease in sensitivity is porportional to the square of the buried depth, assuming the earth to have been properly and uniformly compacted above the array, a compromise is therefore necessary. A burial depth of about one foot is found to be satisfactory in most soils and in sand. The successive piezoceramic discs are preferably, but not necessarily, connected so that their polarities alternate along the line, whereby they tend to cancel out spurious far-field noises or seismic disturbances which emanate at some distance from the line, while at the same time they do not tend to cancel out localized pressure signals which are not likely to be uniformly distributed among a number of neighboring transducers. Thus, a near-field disturbance caused by a footstep or a surface vehicle at one location near the line is not canceled out by adjacent oppositely polled transducers as a general rule.

OBJECTS AND ADVANTAGES OF THE INVENTION

It is a principle object of the invention to provide a transducer line in which the active elements and their wiring are highly protected against ground currents and electromagnetic interferences at all frequencies, typical phenomena being caused by nearby electrical power lines or by lightening, the detector line having a high capability for shielding its active transducer elements and wiring from such field and disturbances.

It is another important object of the invention to provide a high degree of protection of the transducer elements from moisture. In view of the fact that these piezoceramic elements have a very high operating impedance, relatively small amounts of moisture will tend to short circuit or bleed off their response. For this reason, the present invention provides a hermetically sealed transducer array in which the entire line, including the individual transducer shells, is flushed with dry nitrogen and sealed with the nitrogen inside.

Still another important object of the invention is to provide a buried array which is not attractive to gnawing animals which burrow underground and frequently attack plastic coated intrusion detection arrays.

A further object of the invention is to provide a transducer line which has excellent immunity to far-field seismic noises which arrive at the line across a broad front and are therefore cancelled out by the multiple transducer units responding to the front.

Another important object of the invention is to provide a sealed transducer sensing line suitable for burial or emersion in a medium which is relatively inexpensive to manufacture and which requires a minimum amount of machining of the parts prior to their assembly and sealing.

Another very important practical consideration of the invention is to provide an intrusion sensing line which can be easily rolled up for transportation because it is fairly flexible, and which line is sufficiently flexible to follow the contours of the trench as it is buried and as the earth is compacted above it.

Still another object of the invention is to provide a transducer line which can be successfully handled by relatively unskilled workmen, and which is not easily damaged by rough handling.

It is a further object of the invention to provide a novel mounting for the piezoceramic disc using a piece of circuit board which is metal clad on only one side and which has its metal clad side bonded to the piezoceramic disc to form one of its electrodes, this electrode and an electrode bonded on the opposite side of the disc both being made readily accessible so that the wires drawn through the copper tubing are easily soldered to the two electrodes after the piezoceramic disc is installed in the shell cup.

Other objects and advantages of the invention will become apparent during the following discussion of the drawings which illustrate a practical embodiment of the invention.

THE DRAWINGS

PREFERRED EMBODIMENT

Figure 1:
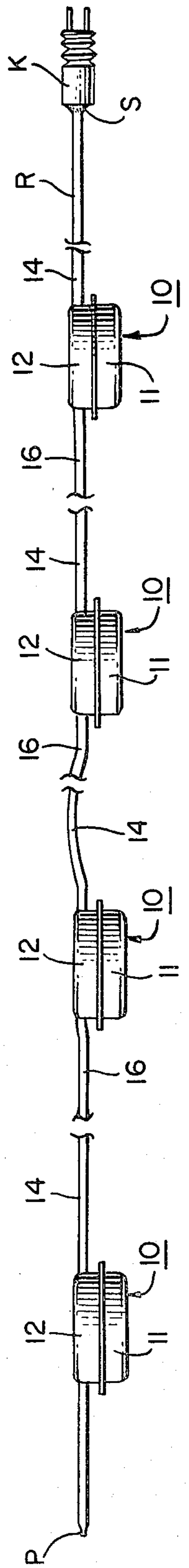
FIG. 1 is an elevation view of a transducer sensing line according to the present invention.
Figure 2:
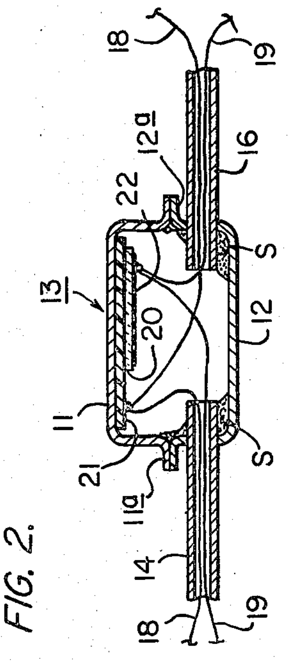
FIG. 2 is a cross-sectional view through one of the transducer shells and the adjacent tubing lengths.
Figure 4:
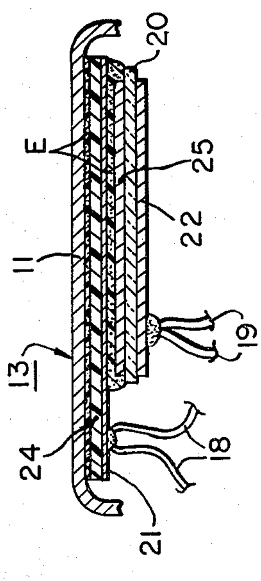
FIG. 4 is an enlarged partial cross-sectional view showing the manner of mounting of the piezoceramic disc inside the shell, and in this respect similar to FIG. 2.

Referring now to the drawing, FIG. 1 shows an elevation view of a pressure responsive intrusion sensing line according to the present invention, the line including a plurality of transducer-containing shells 10, each comprising opposed cups 11 and 12, and each cup 12 having copper tubing extending thereinto. In the manufactured embodiment the shells are about $\frac{3}{4}$ inch in diameter, about $\frac{3}{8}$ inch thick, and are joined together by $\frac{1}{8}$ inch copper tubing. It will be noted that each shell has both an entrance tubing 14 and an exit tubing 16, which usually becomes the entrance tubing 14 of the next shell, since the tubing lengths are continuous between shells. The tubing coming from the last shell in an array is pinched and sealed as shown at P after the assembly has been purged. The tubing houses two insulated wires, 18 and 19, the wires 18 as shown in FIGS. 2 and 4 being connected to the metal cladding 21 on the lower side of an insulating board 24 which is coupled by conductive epoxy cement E to the upper electrode 25 of a transducer member, which also includes a piezoceramic disc 20 and a lower electrode 22 to which the wires 19 are connected. The electrodes 22 and 25 are bonded by the manufacture of the transducer member to the faces of the piezoceramic disc 20. The insulating board 24 separates the inner surface of the diaphragm 13 of the shell 11 from the electrode 25 on the piezoceramic disc 20 so that they are out of electrical contact. The insulating board 24 may be an ordinary fiberboard clad on one side with a thin copper foil 21, although in a preferred form the insulating board comprises glass fibers imbedded in epoxy. This insulating board 24 is also cemented to the inner surface of the cup 11, perhaps using the same epoxy E for that purpose. The cup's surface comprises a pressure responsive diaphragm 13 serving to flex the attached transducer member when the earth above the sensing line is stepped upon.

The copper tubing 14 and 16 passes into each of the cups 12 and is securely soldered therein by solder S which not only supports the shell on the tubing, but also hermetically seals the joint against entry of moisture. Such sealing serves the purpose of keeping an inert gas, preferably dried nitrogen, inside the shells and the tubing so as to maintain a non-corrosive and highly dielectric atmosphere therein.

Figure 3:
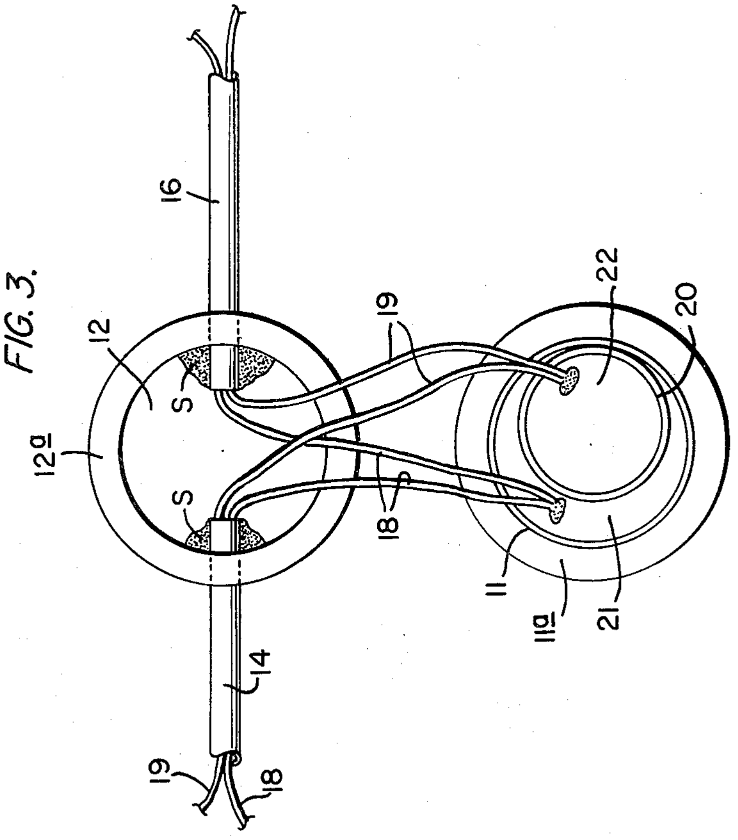
FIG. 3 is an exploded view showing a shell according to FIG. 2 opened up by separating the top and bottom cups and showing the interior of the cups in plan view.

Each of the shell cups 11 and 12 has a flange 11*a* and 12*a* which extends all the way around it, these flanges being tinned and soldered together in the orientation seen in FIG. 2, whereby the cup 11 is fully sealed to the cup 12 after the wiring as shown in FIG. 3 has been completed inside. Thus, all closures of the present transducer line are accomplished by metal-to-metal bonding, whereby the structure is not only very strong, but it is very well-sealed against leakage. The righthand end R of the line as shown in FIG. 1 is soldered into a suitable sealed connector K having two terminals coupled to the wires 18 and 19. The connector K can be attached to a box located on the surface, for instance at a monitoring station, or else can be connected to a cooperative sealed connector on an adjacent line so that two lengths of line can be joined together in cooperative mutual relationship. The exact form of the connectors is not part of the present inventive concept.

Within each transducer line, the transducers in the contiguous shells are preferably connected with their polarities reversed in a manner well-known per se in the prior art. Each piezoceramic unit has polarized outputs on the wires 18 and 19, and therefore such alternation of the polarity can be accomplished merely by inverting the piezoceramic wafers 20 in adjacent transducer shells along the line.

This invention is not to be limited to the exact form shown in the drawing, for obviously changes can be made within the scope of the following claims.

I claim:

1. An intrusion sensing line to be buried below the surface of a medium and operative to deliver electrical signals in response to pressure changes in the medium resulting from intrusive stresses applied thereto, comprising:

(a) multiple sealed metal transducer shells respectively spaced apart along said sensing line and joined together by multiple lengths of flexible metal tubing, the lengths having ends which extend into and terminate within the shells, the tubing and shells being sealed together by metal-to-metal bonding, and each transducer shell having one flat face comprising a diaphragm which is flexible in response to said pressure changes;

(b) a transducer unit inside each shell comprising a thin insulating board having one side overlying and bonded to said diaphragm face and having a flat piezoceramic transducer member bonded to its other side, the member comprising a piezoceramic disc with first and second electrodes bonded to its faces, the insulating board and transducer member and electrodes being operative to flex with said diaphragm face of the shell; and (c) two insulated wires extending through the lengths of tubing and the shells comprising the sensing line, and the wires being coupled respectively with the first and second electrodes in each shell.

2. The sensing line as claimed in claim 1, wherein the metal shells and tubing are soldered together at all joints.

3. The sensing line as claimed in claim 1, wherein each shell comprises two cups, each having an end portion and an annular side portion, and each having an annular flange extending around the side portion, one end portion comprising said diaphragm, the flanges being soldered together to seal the shell, and the side portions having holes therethrough receiving the tubing ends which are soldered to the side portions at the holes.

4. The sensing line as claimed in claim 1 wherein said lengths of tubing comprise soft-drawn copper tubing.

5. The sensing line as claimed in claim 1, wherein the thin insulating board in each transducer unit is metal clad on said other side, the first electrode of the transducer member being conductively bonded to the metal cladding of the insulating board, and said wires being connected respectively with said metal cladding and with said second electrode.

6. The sensing line as claimed in claim 5, wherein said metal clad board is greater in area than the piezoceramic member bonded to it, whereby part of the metal cladding remains exposed for connection with said wires.

7. The sensing line as claimed in claim 1, wherein the tubing and shells are filled with an atmosphere of dry inert gas and sealed to retain the gas.

8. The sensing line as claimed in claim 1, wherein each flat piezoceramic member delivers in response to strain a voltage having predetermined opposite polarity at the two electrodes, and said electrodes being connected to a different one of said wires at each adjacent transducer unit so that the polarities of successive transducer unit signals alternate along the line.

* * * * *